United States Patent [19]

Ota et al.

[11] Patent Number: 5,274,251
[45] Date of Patent: Dec. 28, 1993

[54] SEMICONDUCTOR LIGHT EMITTING ELEMENT

[75] Inventors: Hiroyuki Ota; Atsushi Watanabe, both of Iruma, Japan

[73] Assignee: Pioneer Electronic Corporation, Tokyo, Japan

[21] Appl. No.: 725,684

[22] Filed: Jul. 3, 1991

[30] Foreign Application Priority Data

Nov. 27, 1990 [JP] Japan ............... 2-324589

[51] Int. Cl.$^5$ ............... H01L 49/00; H01L 33/00; H01L 29/161; H01L 29/205
[52] U.S. Cl. ............... 257/78; 257/76; 257/86; 257/103; 257/200
[58] Field of Search ............... 357/16, 17, 61; 257/79, 257/86, 103, 189, 201, 76, 78, 94, 200

[56] References Cited

U.S. PATENT DOCUMENTS

| | | | |
|---|---|---|---|
| 3,982,261 | 9/1976 | Antypas | 357/16 |
| 4,081,764 | 3/1978 | Christmann et al. | 331/94.5 |
| 4,340,966 | 7/1982 | Akiba et al. | 372/45 |
| 5,041,883 | 8/1991 | Lindquist et al. | 357/17 |
| 5,097,298 | 3/1992 | Ehara | 357/17 |

FOREIGN PATENT DOCUMENTS

| | | |
|---|---|---|
| 0342656 | 11/1989 | European Pat. Off. |
| 0395392 | 10/1990 | European Pat. Off. |
| 8014477 | 1/1974 | Japan ............... 357/61 |
| 49-19782 | 2/1974 | Japan. |
| 2016203 | 9/1979 | United Kingdom. |

OTHER PUBLICATIONS

European Search Report.
Patent Abstracts of Japan cited in the European Search Report.

*Primary Examiner*—Andrew J. James
*Assistant Examiner*—Valencia M. Martin
*Attorney, Agent, or Firm*—Keck, Mahin & Cate

[57] ABSTRACT

A semiconductor light emitting element with a high light-emitting efficiency, which is constituted in such a way that, of the composition of its GaN and AlN epitaxial layer, part of N is substituted by P, thus ensuring good lattice-matching with the substrate crystal, ZnO.

6 Claims, 1 Drawing Sheet

SEMICONDUCTOR LIGHT EMITTING ELEMENT

BACKGROUND OF THE INVENTION

1. Field of the Invention

The present invention relates to a light emitting element for use in a laser apparatus.

2. Description of the Prior Art

A conventional light emitting element employing an epitaxial layer of III-V nitride-based mixed crystal, such as GaN, uses sapphire ($\alpha$-$Al_2O_3$) as its substrate crystal.

GaN has a wurtzite type crystal structure, while sapphire serving as the substrate crystal has a corundum type crystal structure. Although both are of a hexagonal system, they are not equivalent; the atomic surface of sapphire has a thirteen repetition periods. Further, GaN and sapphire have significantly different lattice constants and their mutual lattice unmatching goes up to 14%. It is difficult to form a good epitaxial layer because of such lattice unmatching, thus preventing the light emitting elements using these materials from providing light emission with high efficiency.

SUMMARY OF THE INVENTION

Thus, the present invention has been accomplished with the view to overcoming the problem described above. It is therefore an object of the present invention to provide a semiconductor light emitting element which has a good epitaxial layer lattice-matched with the substrate crystal and has a high light-emitting efficiency.

A semiconductor light emitting element according to the present invention comprises a substrate crystal and a semiconductor mixed crystal consisting of multiple compounds belonging to the III-V group, formed as an epitaxial layer on the substrate crystal, the substrate crystal being ZnO and the epitaxial layer having a composition of $Al_xGa_{1-x}N_{1-y}P_y$ ($0 \leq x \leq 1$, $0 < y < 1$).

According to the semiconductor light emitting element of the present invention, of the composition of the GaN and AlN epitaxial layer, part of N is substituted by P, thus ensuring lattice-matching with the substrate crystal, ZnO.

DETAILED DESCRIPTION OF THE PREFERRED EMBODIMENT

Figure 1:
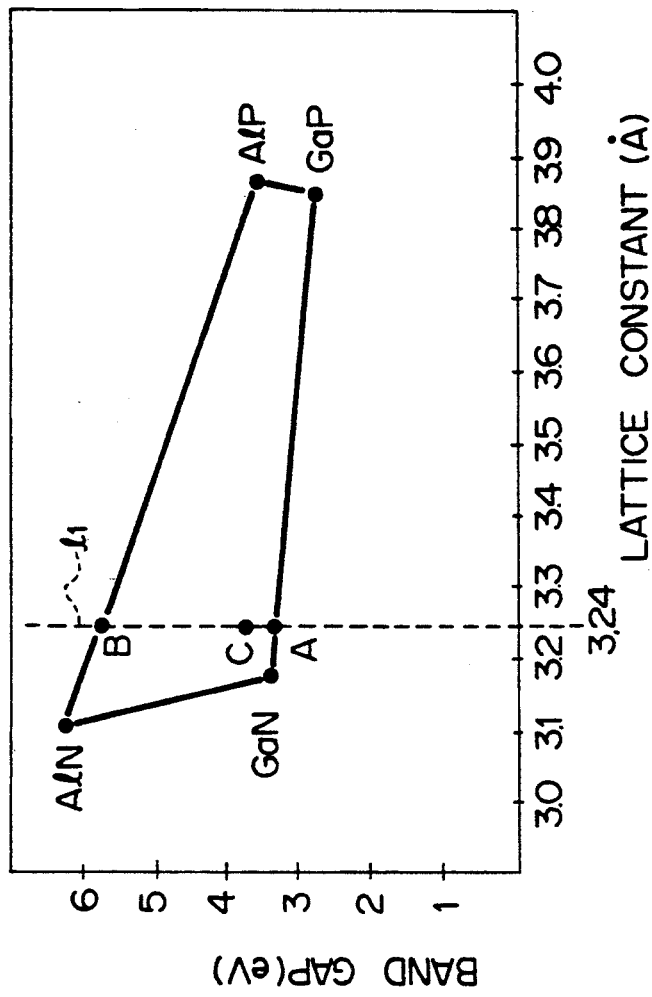
FIG. 1 is a graph illustrating band gaps and lattice constants with respect to compound semiconductors in the III-V group and its mixed crystal.

Multiple compound semiconductors in the III-V group, GaN, AlN, GaP and AlP, have lattice constants and band gaps as indicated by four points of GaN, AlN, GaP and AlP, respectively in FIG. 1, the lattice constants taken on the horizontal scale and the band gaps taken on the vertical scale. In consideration of the Vegard's Law in a mixed crystal system, these four binary semiconductors are mixed in a proper ratio, so that the material values (a lattice constant and a band gap) of a quadri mixed crystal can be realized inside the quadrilateral area surrounded by the solid lines in FIG. 1. In FIG. 1, since GaP and AlP have a sphalerite type crystal structure, the lattice constants of the two are converted so as to match those of nitrides GaN and AlN of a wurtzite type. The band gaps of GaN and AlN, direct transition type semiconductors, are respectively what are acquired at the smallest energy value and at the greatest energy value of each conduction band and valence band. With regard to GaP and AlP, indirect transition type semiconductors, their band gaps are those acquired at the minimum energy value and at the maximum energy value of each conduction band and valence band at point $\Gamma$ (wave number k=0).

The broken straight line 11 in FIG. 1 is the line of the substrate crystal ZnO at the lattice constant of 3.24Å. It is apparent that the substrate crystal ZnO has a wurtzite type crystal structure, the same as that of the semiconductor GaN, and has a lattice constant close to that of GaN. The composition at the intersection A of the line 11 and the line of the ternary mixed crystal between GaN and GaP and the composition at the intersection B of the line 11 and the ternary mixed crystal between AlN and AlP can be estimated as follows in accordance with the Vegard's Law:

Point A: $GaN_{0.91}P_{0.09}$

Point B: $AlN_{0.82}P_{0.18}$

Segment AB indicates a composition range in which the mixed crystal AlGaNP system is lattice-matched with the substrat crystal ZnO. In consideration of the Vegard's Law again, the material values of segment AB will be expressed by a mixed crystal (quadri mixed crystal) between the composition at point A and the composition at point B. Therefore, the lattice matching with the substrate crystal ZnO will be provided by forming an epitaxial layer within the following rough composition range:

$$(GaN_{0.91}P_{0.09})_{1-w}$$

$$(AlN_{0.82}P_{0.18})_w \qquad (1)$$

In constituting a semiconductor laser element, it is typical that the epitaxial layer has a so-called double-hetero-structure. In this case, it is said that to effectively confine photons in an active layer, the band gap of clad layers should preferably be set larger by about 0.3eV than the band gap of the active layer. In the case of using ZnO as the substrate crystal, the active layer and clad layers have only to have compositions selected from the composition range expressed by the above composition formula (1) such that the band gap difference is about 0.3eV. For example, if the composition at point A is selected as the simplest composition for the active layer in FIG. 1, the composition at point C, whose band gap is greater by 0.3eV than that of the composition at A, may be applied to the clad layers. The mixed crystal composition at point C can be calculated from the above-given composition formula of the quadri mixed crystal on the line 11 and the Vegard's Law.

Figure 2:
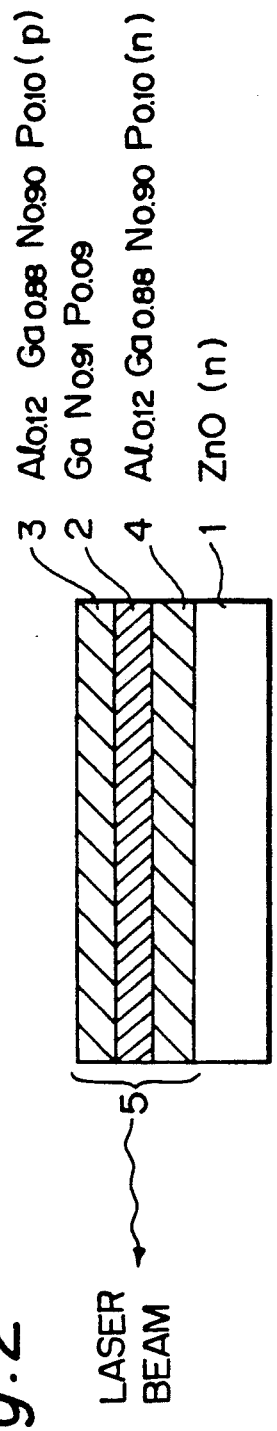
FIG. 2 is a diagram illustrating the structure of a semiconductor laser element with a double heterojunction structure according to one embodiment of the present invention.

FIG. 2 exemplifies the structure of a semiconductor laser element with a double heterojunction structure, which have an active layer and clad layers formed with a mixed crystal of $Al_xGa_{1-x}N_{1-y}P_y$ ($0 \leq x \leq 1$, $0 < y < 1$) that is lattice-matched with the substrate crystal ZnO as described above.

In this example, the substrate crystal 1 is of n type ZnO, and the epitaxial layer 5 includes the active layer 2 made of a mixed crystal of $GaN_{0.91}P_{0.09}$ and the clad layers 3 and 4 respectively made of p type and n type mixed crystals of $Al_{0.12}Ga_{0.88}N_{0.90}P_{0.10}$. According to the thus constituted semiconductor laser element, generally, applying the forward bias to the clad layers causes the active layer to generate photons, so that a laser beam is derived by the optical resonance in the active layer and is emanated from the cleavage plane of the active layer.

Further, if the fact that the active layer also consists of $Al_xGa_{1-x}N_{1-y}P_y$ ($0 \leq x \leq 1$, $0 < y < 1$) is taken into consideration, it is possible to provide a semiconductor laser beam with a short wavelength of 400 nm to 220 nm. It is also possible to form pn junction using the $Al_xGa_{1-x}N_{1-y}P_y$-based mixed crystal which is lattice-matched with the substrate crystal ZnO, thereby providing a light-emitting diode.

As described above, according to the semiconductor light emitting element of the present invention, the substrate crystal is ZnO and, of the composition of the epitaxial layer, part of N in the semiconductors GaN and AlN is substituted by P, thus ensuring lattice-matching with the substrate crystal, ZnO. Therefore, a good epitaxial layer of a GaNP-based mixed crystal or AlGaNP-based mixed crystal can be obtained, which permits the semiconductor light emitting element to have a high light-emitting efficiency.

What is claimed is:

1. A semiconductor light emitting element compromising:
    a substrate crystal; and
    a semiconductor mixed crystal consisting of multiple compounds belonging to the III-V group, formed as an epitaxial layer on the substrate crystal, the substrate crystal being ZnO and the epitaxial layer having a composition of $Al_xGa_{1-x}N_{1-y}P_y$ ($0 \leq x \leq 1$, $0 < y < 1$) wherein the semiconductor mixed crystal is lattice-matched with the substrate crystal.

2. A semiconductor light emitting element according to claim 1, wherein said epitaxial layer is made of n-type $Al_xGa_{1-x}N_{1-y}P_y$ ($0 \leq x \leq 1$, $0 < y < 1$) as a first clad layer, and said semiconductor light emitting element further comprises an active layer made of a mixed crystal of n-conductivity type or p-conductivity type $Al_xGa_{1-x}N_{1-y}P_y$ ($0 \leq x \leq 1$, $0 < y < 1$) formed on said first clad layer and a second clad layer made of p-type $Al_xGa_{1-x}N_{1-y}P_y$ ($0 \leq x \leq 1$, $0 < y < 1$) formed on said active layer.

3. A semiconductor light emitting element according to claim 2, wherein said first and second clad layers have band-gaps respectively larger by 0.3eV than that of the active layer.

4. A semiconductor light emitting element comprising
    a substrate crystal; and
    a semiconductor mixed crystal consisting of multiple compounds belonging to the III-V group, formed as an epitaxial layer on the substrate crystal, the substrate crystal being ZnO and the epitaxial layer having a composition of $Al_xGa_{1-x}N_{1-y}P_y$ where $0 \leq x \leq 1$ and $0.09 < y < 0.18$, whereby the semiconductor mixed crystal is lattice-matched with the substrate crystal.

5. A semiconductor light emitting element according to claim 3, wherein said epitaxial layer on said substrate crystal made of n-conductivity type $Al_{0.12}Ga_{0.88}N_{0.90}P_{0.10}$ as a first clad layer, and said semiconductor light emitting element further comprises an active layer made of a mixed crystal of $GaN_{0.91}P_{0.09}$ formed on said first clad layer and a second clad layer made of p-conductivity type $Al_{0.12}Ga_{0.88}N_{0.90}P_{0.10}$ formed on said active layer.

6. A semiconductor light emitting element according to claim 5, wherein said first and second clad layers have band-gaps respectively larger by 0.3eV than that of the active layer.

* * * * *